(12) United States Patent
Suhonen

(10) Patent No.: US 9,325,297 B2
(45) Date of Patent: Apr. 26, 2016

(54) POWER SUPPLY CONTROL

(71) Applicant: ST-Ericsson SA, Plan-les-Ouates (CH)

(72) Inventor: Markus Suhonen, Paimio, FL (US)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/426,762

(22) PCT Filed: Sep. 25, 2013

(86) PCT No.: PCT/EP2013/069962
§ 371 (c)(1),
(2) Date: Mar. 9, 2015

(87) PCT Pub. No.: WO2014/048985
PCT Pub. Date: Apr. 3, 2014

(65) Prior Publication Data
US 2015/0236677 A1    Aug. 20, 2015

Related U.S. Application Data

(60) Provisional application No. 61/708,746, filed on Oct. 2, 2012.

(30) Foreign Application Priority Data

Sep. 28, 2012 (EP) .................................... 12186621

(51) Int. Cl.
*H04L 27/00* (2006.01)
*H03K 3/012* (2006.01)
(Continued)

(52) U.S. Cl.
CPC ...... *H03K 3/012* (2013.01); *G05F 1/66* (2013.01);
*H03K 5/06* (2013.01); *H04L 7/0037* (2013.01);
*H04L 7/0087* (2013.01); *H04L 7/0091* (2013.01)

(58) Field of Classification Search
CPC ..................................................... H03L 7/0814
See application file for complete search history.

(56) References Cited

U.S. PATENT DOCUMENTS 6,515,530 B1 *   2/2003   Boerstler .................. G06F 1/08
                                                                       327/291
6,731,158 B1    5/2004   Hass (Continued)

FOREIGN PATENT DOCUMENTS

JP            62-60020 A      3/1987

OTHER PUBLICATIONS

International Search Report issued in corresponding International application No. PCT/EP2013/069962, date of mailing of the report Apr. 16, 2014.

(Continued)

*Primary Examiner* — Shuwang Liu
*Assistant Examiner* — Gina McKie
(74) *Attorney, Agent, or Firm* — Patent Portfolio Builders PLLC

(57) ABSTRACT

An integrated circuit includes a clock generation stage that generates a clock signal having a clock frequency dependent on a reference signal. A delay stage generates a delayed clock signal by delaying the clock signal. A control stage generates a control signal indicative of a delay of the delayed clock signal relative to the clock signal. A frequency divider generates a divided signal by dividing a dividend signal having a dividend frequency dependent on the reference signal. A power supply regulator supplies power to the frequency divider at a first power level, which is dependent on the control signal.

14 Claims, 6 Drawing Sheets

(51) Int. Cl.
  *H03K 5/06*  (2006.01)
  *G05F 1/66*  (2006.01)
  *H04L 7/00*  (2006.01)

(56) References Cited

U.S. PATENT DOCUMENTS

| | | |
|---|---|---|
| 7,224,199 B1 | 5/2007 | Kang |
| 2002/0033721 A1* | 3/2002 | Tachimori .................... 327/158 |
| 2010/0017636 A1* | 1/2010 | Hashimoto ........... G06F 1/3203 713/322 |
| 2010/0040120 A1* | 2/2010 | Sharma ........................ 375/219 |

OTHER PUBLICATIONS

Written Opinion of the International Searching Authority issued in corresponding International application No. PCT/EP2013/069962, date of mailing Apr. 16, 2014.

Extended European Search Report issued in corresponding European patent application No. EP 12 18 6621, date of completion of the report Feb. 19, 2013.

* cited by examiner

POWER SUPPLY CONTROL

TECHNICAL FIELD

The present disclosure relates to an integrated circuit, a method of operating an integrated circuit, a wireless communication apparatus comprising an integrated circuit, and a method of operating a wireless communication apparatus comprising an integrated circuit.

BACKGROUND

Process variation is a problem for high-speed digital logic implemented in a semiconductor integrated circuit. The high-speed digital logic should be designed so that it operates correctly in all regions of an integrated circuit wafer, in particular in the worst corners of the wafer where process parameters can cause transistors to be slowest and temperature can be highest. However, this can result in a design in which a high current is used in other areas of the wafer where transistors can be faster and temperature can be lower. Moreover, the need for an integrated circuit to operate over a range of temperatures and frequencies can result in a design in which a high current is used during operation at normal temperature and frequencies. This problem can be particularly severe for an integrated circuit that is required to operate at a high frequency, such as several gigahertz, where low power operation is more difficult to achieve. There is, therefore, a requirement to reduce power consumption of integrated circuits subject to process, temperature and frequency variations.

SUMMARY

According to a first aspect there is provided an integrated circuit comprising:
a clock generation stage arranged to generate a clock signal having a clock frequency dependent on a reference signal;
a delay stage arranged to generate a delayed clock signal by delaying the clock signal;
a control stage arranged to generate a control signal indicative of a delay of the delayed clock signal relative to the clock signal;
a frequency divider arranged to generate a divided signal by dividing a dividend signal having a dividend frequency dependent on the reference signal; and
a power supply regulator arranged to supply power to the frequency divider at a first power level, the first power level being dependent on the control signal.

According to a second aspect there is provided a method of operating an integrated circuit, comprising:
providing a clock signal having a clock frequency dependent on a reference signal;
generating a delayed clock signal by delaying the clock signal in a delay stage of the integrated circuit;
generating a control signal indicative of a delay of the delayed clock signal relative to the clock signal;
generating a divided signal by dividing, in a frequency divider of the integrated circuit, a dividend signal having a dividend frequency dependent on the reference signal; and
supplying power to the frequency divider at a first power level, the first power level being dependent on the control signal.

Therefore, the power supplied to the frequency divider, which is part of the integrated circuit, by the power supply regulator can be dependent on the control signal, and therefore dependent on the delay provided by the delay stage, which is also part of the integrated circuit. Variations in process, temperature and frequency that affect the operation of the integrated circuit can cause the delay provided by the delay stage to vary, and therefore can cause the control signal to vary. Consequently, the power supplied to the frequency divider can be changed in response to such variations to partially or fully compensate for the variations. In particular, a reduction in the first power level can result in a reduction of the power consumed by the frequency divider, and therefore varying the first power level dependent on the control signal can conserve power.

The clock signal may comprise pulses having a pulse duration not exceeding fifty percent of a period of the clock signal, where the pulse duration is defined at a mid value of the clock signal, and the delay stage may be arranged to delay the clock signal by less than the pulse duration. Likewise, in the method according to the second aspect, the clock signal may comprise pulses having a pulse duration not exceeding fifty percent of a period of the clock signal, where the pulse duration is defined at a mid value of the clock signal, and the method may comprise delaying the clock signal by less than the pulse duration. This feature enables a low complexity implementation.

The control stage may be arranged to generate an intermediate signal having a first level in response to the clock signal and the delayed clock signal both being above a clock signal threshold and a second level otherwise, and the control stage may comprise a filter arranged to filter the intermediate signal to provide the control signal. Likewise, the method may comprise generating an intermediate signal having a first level in response to the clock signal and the delayed clock signal both being above a clock signal threshold and a second level otherwise, and filtering the intermediate signal to provide the control signal. This enables the control signal to be generated in a low complexity manner. In particular, the control stage may comprise a logical AND gate arranged to generate the intermediate signal. Alternatively, the control stage may comprise a logical NAND gate arranged to generate the intermediate signal. Likewise, in the method, generating the intermediate signal may comprise forming a logical AND or a logical NAND of the clock signal and the delayed clock signal. In this way, the intermediate signal can be generated in a low complexity manner as a logical AND or NAND of the clock signal before and after being delayed.

The control stage may be arranged to generate an intermediate signal having a first level in response to the clock signal and the delayed clock signal both being below a clock signal threshold and a second level otherwise, and the control stage may comprise a filter arranged to filter the intermediate signal to provide the control signal. Likewise, the method may comprise generating an intermediate signal having a first level in response to the clock signal and the delayed clock signal both being below a clock signal threshold and a second level otherwise, and filtering the intermediate signal to provide the control signal. This enables the control signal to be generated in a low complexity manner. In particular, the control stage may comprise a logical OR gate arranged to generate the intermediate signal. Alternatively, the control stage may comprise a logical NOR gate arranged to generate the intermediate signal. Likewise, in the method, generating the intermediate signal may comprise forming a logical OR or a logical NOR of the clock signal and the delayed clock signal. In this way, the intermediate signal can be generated in a low complexity manner as a logical OR or NOR of the clock signal before and after being delayed.

In one embodiment, the dividend signal and the clock signal may be the reference signal. In this case, the dividend frequency and the clock frequency are equal to a reference frequency of the reference signal. This enables a low complexity implementation in which variations in the frequency divider do not affect the clock signal because the clock signal is not derived from the frequency divider.

In another embodiment, the clock generation stage may comprise the frequency divider, the dividend signal may be the reference signal and the clock signal may be the divided signal. In this case, the dividend frequency is equal to the reference frequency and the clock frequency is equal to a divided frequency of the divided signal. In this configuration, variations in the delay stage do not affect the dividend signal because the dividend signal is not derived from the delay stage or divider, thereby enabling low noise operation, and the delay stage operates at the relatively low frequency of the divided signal, thereby enabling low power operation.

In a further embodiment, the clock signal may be the reference signal and the dividend signal may be the delayed clock signal. In this case the clock frequency is equal to the reference frequency and the dividend frequency is equal to the clock frequency. This enables a low complexity architecture in which the delay stage operates at the relatively high frequency of the dividend signal.

The first power level may have a first power value in response to the control signal being below a control threshold and a second power value in response to the control signal being above the control threshold.

The power supply regulator may be arranged to supply power to the frequency divider at the first power level by supplying power to the frequency divider at a first voltage, the first voltage being dependent on the control signal.

According to a third aspect there is provided a wireless communication apparatus comprising an integrated circuit according to the first aspect.

According to a fourth aspect there is provided a method of operating a wireless communication apparatus comprising an integrated circuit, the method comprising operating the integrated according to the second aspect.

In the wireless communication apparatus according to the third aspect the power supply regulator may be arranged to supply power to the frequency divider at either, dependent on a parameter of a radio frequency signal, the first power level dependent on the control signal or a second power level independent of the control signal. Likewise, the method of operating a wireless communication apparatus according to the fourth aspect, may comprise supplying power to the frequency divider at either, dependent on a parameter of a radio frequency signal, the first power level dependent on the control signal or a second power level independent of the control signal. This enables improved control of the power consumption and noise performance of the wireless communication apparatus. The parameter of the radio frequency signal may be an attribute or characteristic of the radio frequency signal.

Noise generated by the frequency divider can affect the noise of a radio frequency signal transmitted by a radio frequency transmitter, or the sensitivity of a radio frequency receiver used for receiving a radio frequency signal. Therefore, incorporating the frequency divider in the integrated circuit and controlling its power supply dependent on the control signal enables the noise generated by the frequency divider, and the power consumed by the frequency divider, to be controlled dependent on process, temperature and frequency variations of the integrated circuit and on a transmit power level of a transmitted radio frequency signal or signal quality of a received radio frequency signal.

Therefore, in one example, the wireless communication apparatus may comprise:

a radio frequency transmitter arranged to transmit the radio frequency signal at a selectable transmit power level and at a transmit frequency dependent on a frequency of the divided signal;
wherein the parameter of the radio frequency signal may be the selectable transmit power level; and
wherein the power supply regulator may be arranged to supply power to the frequency divider
at the first power level dependent on the control signal if the selectable transmit power level is below a transmit power threshold, and
at the second power level independent of the control signal if the selectable transmit power level is not below the transmit power threshold.

Likewise, the method of operating a wireless communication apparatus may comprise:
selecting a transmit power level;
wherein the parameter of the radio frequency signal may be the selected transmit power level;
supplying power to the frequency divider
at the first power level dependent on the control signal if the selected transmit power level is below a transmit power threshold, and
at the second power level independent of the control signal if the selected transmit power level is not below the transmit power threshold; and
transmitting at the selected transmit power level and at a transmit frequency dependent on a frequency of the divided signal.

Therefore, when the transmit power is relatively low, that is, below the transmit power threshold, the power supplied to the frequency divider can be varied dependent on variations of the delay provided by the delay stage, and this power is referred to as the first power level. In contrast, when the transmit power is relatively high, that is, at or above the transmit power threshold, the power supplied to the frequency divider can be independent of variations in the delay provided by the delay stage, and this power is referred to as the second power level. Reducing the power supplied to the frequency divider can reduce the power consumption of the frequency divider, but increase the noise generated by the frequency divider, and consequently increase the noise output of the transmitter when the divided signal is employed as a local oscillator signal for up-converting a signal for transmission. When a relatively high transmit power level is selected, that is, at or above the transmit power threshold, and the noise output of the transmitter is correspondingly high, the second power level can be used instead of the first power level, as this is independent of the control signal and will not cause the noise to increase further when the control signal varies. Conversely, when a relatively low transmit power level is selected, that is, below the transmit power threshold, and the noise output of the transmitter is correspondingly low, the first power level can be used as this is dependent on the control signal and will enable power to be conserved when the control signal varies.

In another example, the wireless communication apparatus may comprise:
a radio frequency receiver arranged to down-convert the radio frequency signal to a lower frequency, the lower frequency being dependent on a frequency of the divided signal;
wherein the parameter of the radio frequency signal may be a signal quality of the radio frequency signal; and
a signal quality assessment stage arranged to generate an indication of the signal quality of the radio frequency signal;
wherein the power supply regulator may be arranged to supply power to the frequency divider at the first power level dependent on the control signal if the
signal quality of the radio frequency signal is greater
than a quality threshold, and
at the second power level independent of the control signal
if the signal quality of the radio frequency signal is less
than the quality threshold.

Likewise, the method of operating a wireless communication apparatus may comprise:
down-converting the radio frequency signal to a lower frequency, the lower frequency being dependent on a frequency of the divided signal;
wherein the parameter of the radio frequency signal may be a signal quality of the radio frequency signal;
generating an indication of signal quality of the radio frequency signal; and
supplying power to the frequency divider
at the first power level dependent on the control signal if the
signal quality of the radio frequency signal is greater
than a quality threshold, and
at the second power level independent of the control signal
if the signal quality of the radio frequency signal is less
than the quality threshold.

Therefore, when the signal quality of the radio frequency signal, as indicated by the indication of signal quality, is relatively high, that is, above the quality threshold, the power supplied to the frequency divider can be varied dependent on variations of the delay provided by the delay stage, and this voltage is referred to as the first power level. In contrast, when the signal quality of the radio frequency signal, as indicated by the indication of signal quality, is relatively low, that is, below the quality threshold, the power supplied to the frequency divider can be independent of variations in the delay provided by the delay stage, and this power is referred to as the second power level. Reducing the power supplied to the frequency divider can reduce the power consumed by the frequency divider, but increase the noise generated by the frequency divider, and consequently reduce the sensitivity of the radio frequency receiver. When the signal quality of the radio frequency signal is relatively low, that is, below the quality threshold, and so the noise generated by the frequency divider is relatively high and the sensitivity of the radio frequency receiver is correspondingly low, the second power level can be used instead of the first power level, as this is independent of the control signal and will not cause the sensitivity to decrease further when the control signal varies. Conversely, when the signal quality of the radio frequency signal is relatively high, that is, above the quality threshold, and so the noise generated by the frequency divider is relatively low and the sensitivity of the radio frequency receiver is correspondingly high, the first power level can be used as this is dependent on the control signal and will enable power to be conserved when the control signal varies.

The signal quality assessment stage may be arranged to generate the indication of signal quality of the radio frequency signal dependent on a received signal strength of the radio frequency signal. Likewise, the method of operating a wireless communication apparatus may comprise generating the indication of signal quality of the radio frequency signal dependent on a received signal strength of the radio frequency signal. This feature can provide a low complexity way of determining signal quality.

In particular, in one example, the indication of signal quality of the radio frequency signal indicates the signal quality is less than the quality threshold in response to the received signal strength of the radio frequency signal exceeding a received signal strength threshold. This feature can enable the presence of a blocking signal, which may cause a high received signal strength to be indicated, but which may degrade the sensitivity of the radio frequency receiver, to be indicated as a relatively low signal quality, and therefore can cause the power supply regulator to supply power to the frequency divider at the second voltage independent on the control signal, thereby preventing any further reduction in sensitivity that might result from supplying power to the frequency divider at the first voltage dependent on the control signal. Moreover, if no blocking signal is present, an indication of a high received signal strength corresponds to a relatively high sensitivity, and so use of the second voltage, rather than the first voltage, for supplying power to the frequency divider is acceptable as any further improvement in sensitivity that would have been available by using the first voltage is not required.

BRIEF DESCRIPTION OF THE DRAWINGS

Preferred embodiments will now be described, by way of example only, with reference to the accompanying drawings, in which.

DETAILED DESCRIPTION

Figure 1:
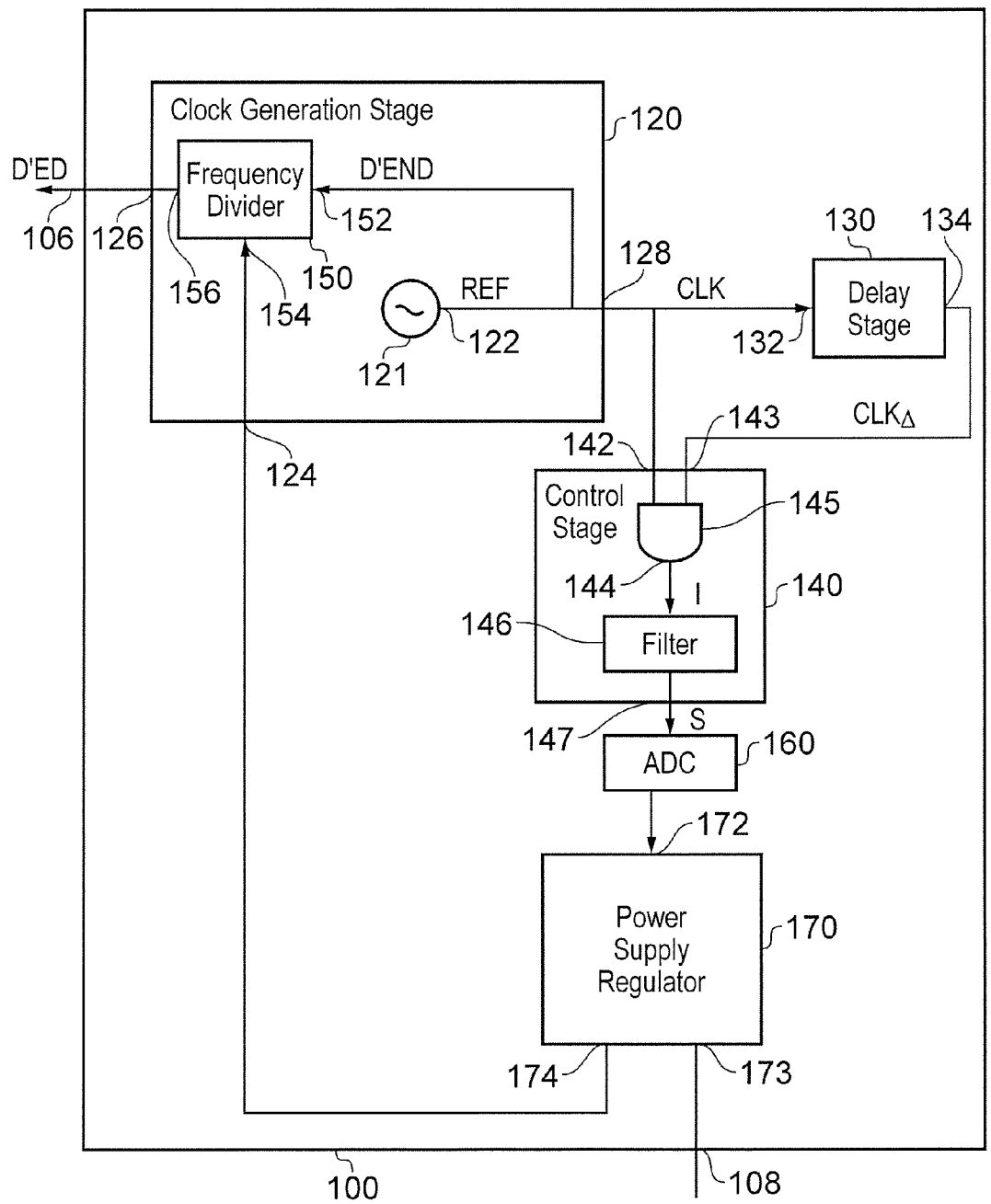
FIG. 1 is a block schematic diagram of a first embodiment of an integrated circuit.

Referring to FIG. 1, an integrated circuit 100 comprises a clock generation stage 120. The clock generation stage 120 comprises an oscillator 121, for generating a reference signal REF having a reference frequency, and a frequency divider 150. The frequency divider 150 has a first input 152 for a dividend signal D'END having a dividend frequency, and an output 122 of the oscillator 121 is coupled to the first input 152 of the frequency divider 150 for delivering the reference signal REF to the frequency divider 150 as, in this embodiment, the dividend signal D'END. Therefore, in this embodiment, the dividend frequency is equal to the reference frequency. The frequency divider 150 divides the dividend signal D'END and delivers a divided signal D'ED at an output 156 of the frequency divider 150. The output 156 of the frequency divider 150 is coupled to a first output 126 of the clock generation stage 120 for delivering the divided signal D'ED to other, non-illustrated elements of the integrated circuit 100. Moreover, the first output 126 of the frequency divider 150 is coupled to an output 106 of the integrated circuit 100 for delivering the divided signal D'ED to devices external to the integrated circuit 100.

The output 122 of the oscillator 121 is coupled to a second output 128 of the clock generation stage 120 for delivering a clock signal CLK, which in this embodiment, is the reference signal REF. The clock signal CLK has a clock frequency with a clock period T, that is, the clock frequency is 1/T, and in this embodiment the clock frequency is equal to the reference frequency. The second output 128 of the clock generation stage 120 is coupled to an input 132 of a delay stage 130, and an output 134 of the delay stage 130 delivers a delayed clock signal $CLK_A$, corresponding to the clock signal CLK delayed by a delay Δ. The clock signal CLK comprises pulses of duration P, where the pulse duration P is defined at a mid value of the clock signal CLK, and where P is no greater than half of the clock period T. This constraint can ensure that the trailing, or falling, edges of the pulses of the clock signal CLK do not occur before the preceding leading, or rising, edge of the pulses when delayed by the delay stage 130. Although such a constraint is not essential, it can enable a low complexity implementation by enabling an intermediate signal I, described below, to have pulses of duration proportional to the delay provided by the delay stage 130, and consequently enables a control signal S, also described below, to have an average value proportional to the delay provided by the delay stage 130. The pulses may have either a rising leading edge or a falling leading edge, that is, the pulses may have a voltage that is either relatively high or relatively low with respect to the voltage between the pulses. As the clock signal is periodic with clock period T, the interval T-P between pulses is greater than, or equal to, half of the clock period T, and the clock signal in the interval between pulses may be regarded as a complementary pulse having a duration T-P. The value of the delay Δ is less than the pulse duration P. The pulses of the clock signal CLK may be square, rectangular, sinusoidal or have another shape, the precise shape not being particularly critical to the operation of the integrated circuit 100. The delay stage 130 may comprise, for example, two inverters coupled in series.

The second output 128 of the clock generation stage 120 is also coupled to a first input 142 of a control stage 140, and the output 134 of the delay stage 130 is coupled to a second input 143 of the control stage 140. The control stage 140 comprises a logical AND gate 145 having a first input coupled to the first input 142 of the control stage 140 and a second input coupled to the second input 143 of the control stage 140. An output 144 of the AND gate 145 delivers the intermediate signal I, which is a logical AND of the clock signal CLK and the delayed clock signal $CLK_A$. Therefore, the intermediate signal I is a binary signal having a first level if the clock signal CLK and the delayed clock signal $CLK_A$ are both above a clock signal threshold, which is a logic threshold, and a second level otherwise, that is, if either or both of the clock signal CLK and the delayed clock signal $CLK_A$ are below the clock signal threshold. The output 144 of the AND gate 145 is coupled to an output 147 of the control stage 140 by means of a filter 146 for smoothing transitions in the intermediate signal I to provide the control signal S at an output 147 of the control stage 140. The filter 146 may be, in particular, a low pass filter.

The output 147 of the control stage 140 is coupled to a first input 172 of a power supply regulator 170 by means of an analogue-to-digital converter (ADC) 160 for digitising the control signal S. An output 174 of the power supply regulator 170 is coupled to a power control input 124 of the clock generation stage 120 for supplying power to the clock generation stage 120. The power supply regulator 170 controls the supply of power to the clock generation stage 120 dependent on the control signal S. For example, the power supply regulator 170 may control a voltage or a current, or, more generally, power, supplied to the clock generation stage 120 dependent on the control signal S. Therefore, a voltage, referred to herein as the first voltage, supplied by the power supply regulator 170 can have a first voltage value if the control signal S is below a control threshold, and the first voltage can have a second voltage value if the control signal S is above the control threshold. Alternatively, a current, referred to herein as the first current, supplied by the power supply regulator 170 can have a first current value if the control signal S is below a control threshold, and the first current can have a second current value if the control signal S is above the control threshold. Likewise, more generally, a power, referred to herein as the first power level, supplied by the power supply regulator 170 can have a first power value if the control signal S is below a control threshold, and the first power level can have a second power value if the control signal S is above the control threshold. The power control input 124 of the clock generation stage 120 is coupled to, in particular, a second input 154 of the frequency divider 150 for controlling the supply of power to the frequency divider 150. In some applications, after a value of the control signal S has been determined, during a calibration mode, based on the delay provided by the delay stage 130, a supply of power to the control stage 140, the ADC 160 and the delay stage 130 may be switched off to conserve power.

In operation, deviations in the speed of operation of the integrated circuit 100 from a design target value, due to process variations or temperature and frequency variations, and more specifically variations which affect rise and fall times of signals, will cause the delay introduced by the delay stage 130 to deviate from a design target value. Such deviations or variations cause the duty cycle of the intermediate signal I at the output of the AND gate 145 to vary or deviate from a design target value, and therefore cause an average value of the control signal S at the output of the filter 146 to vary or deviate from a design target value. Therefore the control signal S may have a DC value indicative of, and preferably proportional to, the delay introduced by the delay stage 130. In response to such a deviation of the control signal S, the power supply regulator 170 controls the power delivered to the frequency divider 150, by changing at least one of the voltage and current at the output 174 of the power supply regulator 170, in order to compensate for the deviation. Because the delay stage 130 and the frequency divider 150 are implemented on the integrated circuit 100, variations that affect the delay provided by the delay stage 130 also affect the frequency divider 150 in a similar manner. For example, a reduction in rise time of the delayed clock signal $CLK_A$ at the output 134 of the delay stage 130, due to the delay stage 130, will correspond to a reduction in rise time of signals in the frequency divider 150. Control of the power delivered to the frequency divider 150 by the power supply regulator 170 can, partly or fully, compensate for the reduction in rise time by, for example, by increasing the voltage at the output 174 of the power supply regulator 170. Conversely, an increase in rise time of the delayed clock signal $CLK_A$ at the output 134 of the delay stage 130, due to the delay stage 130, will correspond to an increase in rise time of signals in the frequency divider 150. Control of the power delivered to the frequency divider 150 by the power supply regulator 170 can compensate for the increase in rise time, which corresponds to an increase in delay provided by the delay stage 130, by, for example, increasing the voltage at the output 174 of the power supply regulator 170. By the use of such a control system, the power consumption of the integrated circuit 100 can be reduced by avoiding the need to allow a margin, or at least reducing the size of the margin provided for such variations and deviations.

In the embodiment illustrated in FIG. 1, the power supply regulator 170 comprises a second input 173 coupled to an input 108 of the integrated circuit 100. The function of this input 108 of the integrated circuit 100 is described below.

Figure 2:
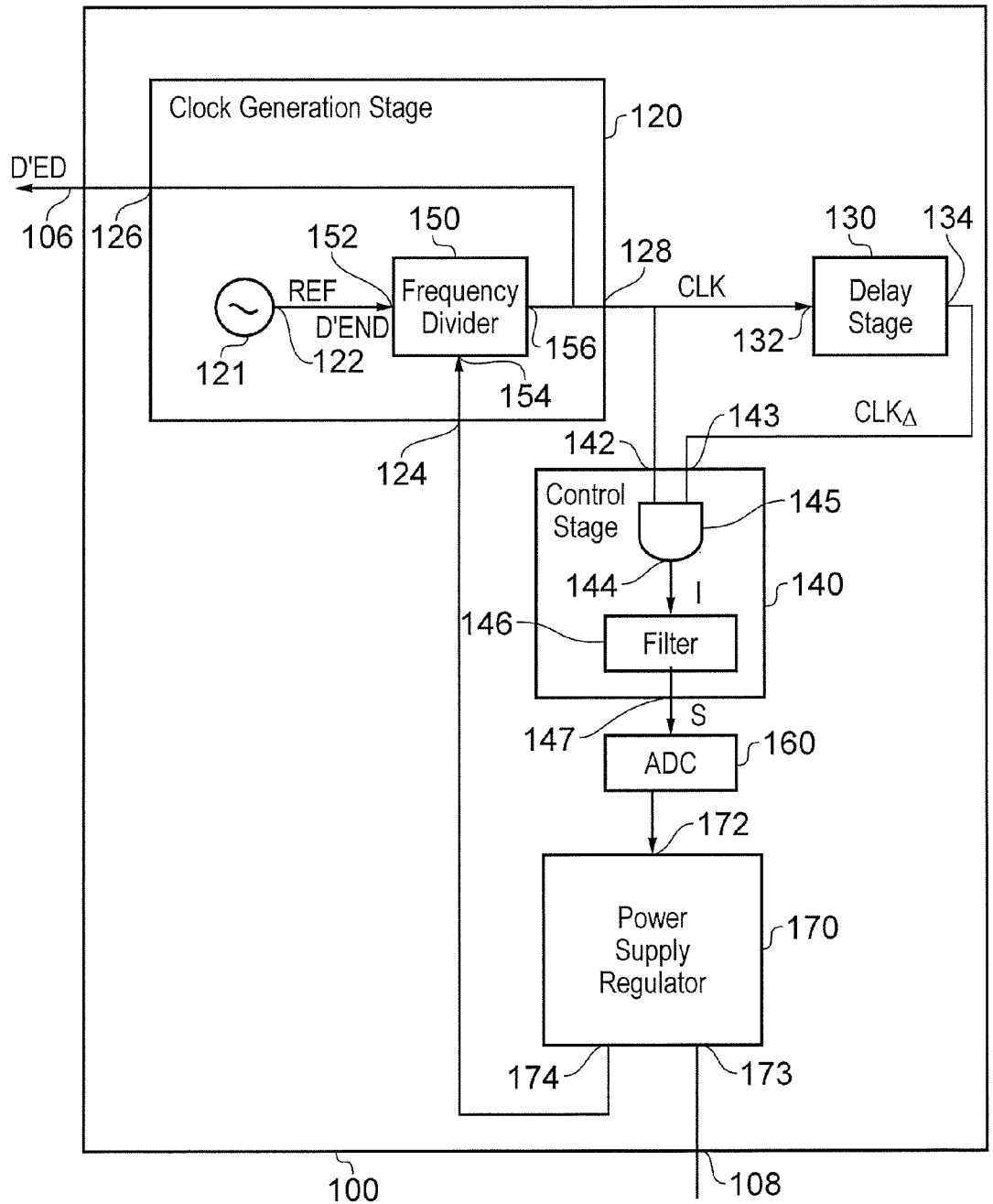
FIG. 2 is a block schematic diagram of a second embodiment of an integrated circuit.

FIG. 2 illustrates a first variation of the integrated circuit 100 described with reference to FIG. 1, in which, instead of the output 122 of the oscillator 121 being coupled to the output 128 of the clock generation stage 120, the output of the frequency divider 150 is coupled to the output 128 of the clock generation stage 120. In this case, the clock signal CLK is the divided signal, and the clock frequency is equal to the frequency of the divided signal. In all other respects, the description of the integrated circuit 100 with reference to FIG. 1 is applicable to the embodiment illustrated in FIG. 2.

Figure 3:
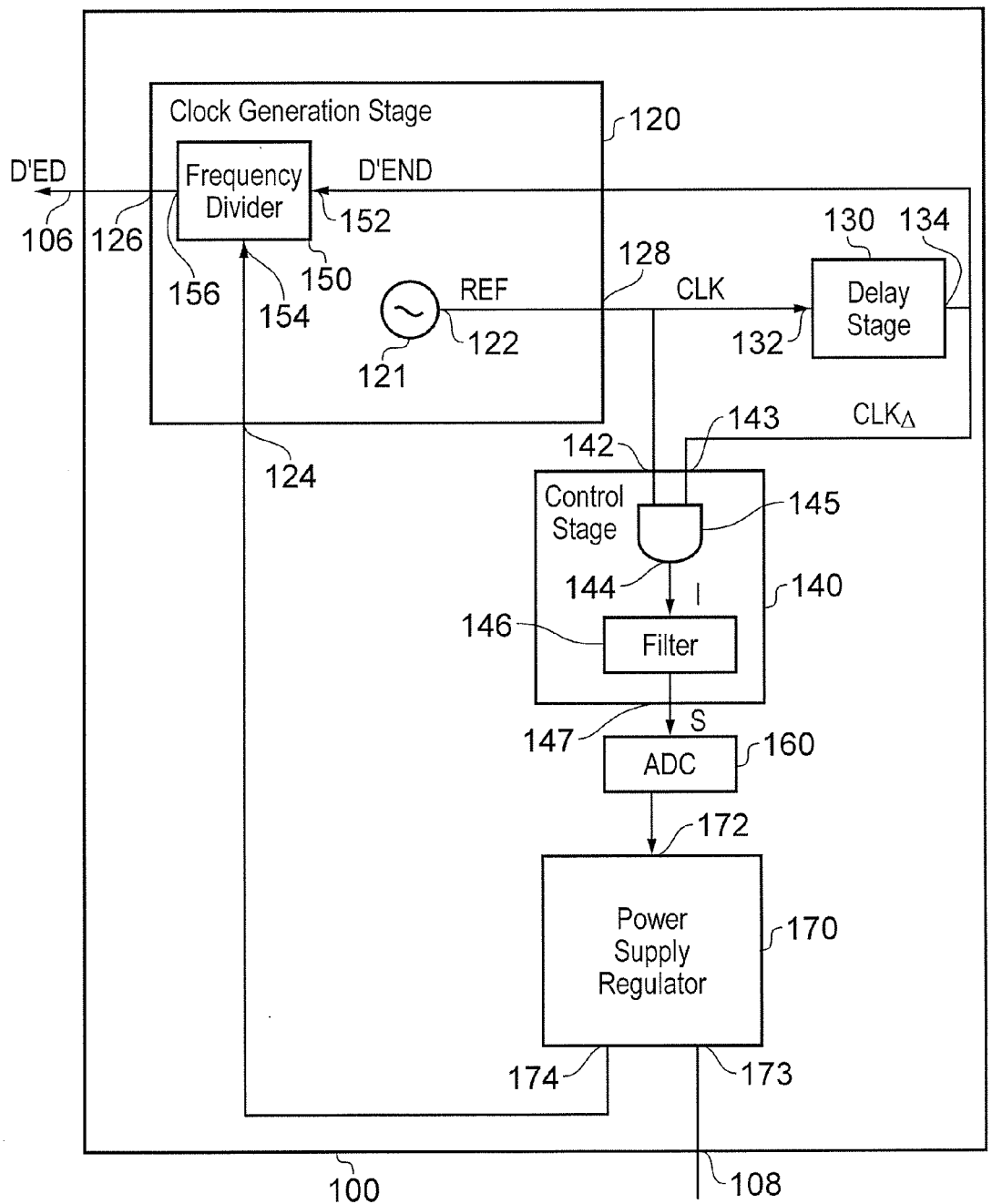
FIG. 3 is a block schematic diagram of a third embodiment of an integrated circuit.

FIG. 3 illustrated a second variation of the integrated circuit 100 described with reference to FIG. 1, in which the first input 152 of the frequency divider 150 is coupled to the output 134 of the delay stage 130 instead of to the output 122 of the oscillator 121. In this case, the dividend signal D'END is the delayed clock signal $CLK_A$, and the dividend frequency is equal to the clock frequency. In all other respects, the description of the integrated circuit 100 with reference to FIG. 1 is applicable to the embodiment illustrated in FIG. 3.

In a further variation of the integrated circuit 100 described with reference to FIG. 1, 2 or 3, the control stage 140 may comprise a NAND gate, OR gate or NOR gate in place of the AND gate 145. More generally, the control signal S is indicative of the relative phase, that is, phase difference, or delay Δ, between the clock signal CLK and the delayed clock signal $CLK_A$, and other circuits may be used to generate the control signal S from the clock signal CLK and the delayed clock signal $CLK_A$. In particular, the control signal S can be proportional to the value of the delay Δ.

Although an example has been described in which the delay stage 130 comprises two inverters coupled in series, in another example the delay stage 130 may comprise any even number of inverters.

The ADC 160 may be omitted, with the output 147 of the control stage 140 being coupled directly to the first input 172 of the power supply regulator 170 if the power supply regulator 170 is arranged to received the control signal S in an analogue format, rather than a digital format.

In the embodiments described with reference to FIGS. 1, 2 and 3, the oscillator 121 is illustrated as being part of the clock generation stage 120 of the integrated circuit 100. However, this is not essential. For example, the reference signal may be generated externally to the integrated circuit 100.

In the embodiments described with reference to FIGS. 1, 2 and 3, the integrated circuit 100 comprises the control stage 140, the ADC 160, the power supply regulator 170 and the oscillator 121. However, this is not essential and any, or all, of these elements may be external to the integrated circuit 100.

Figure 4:
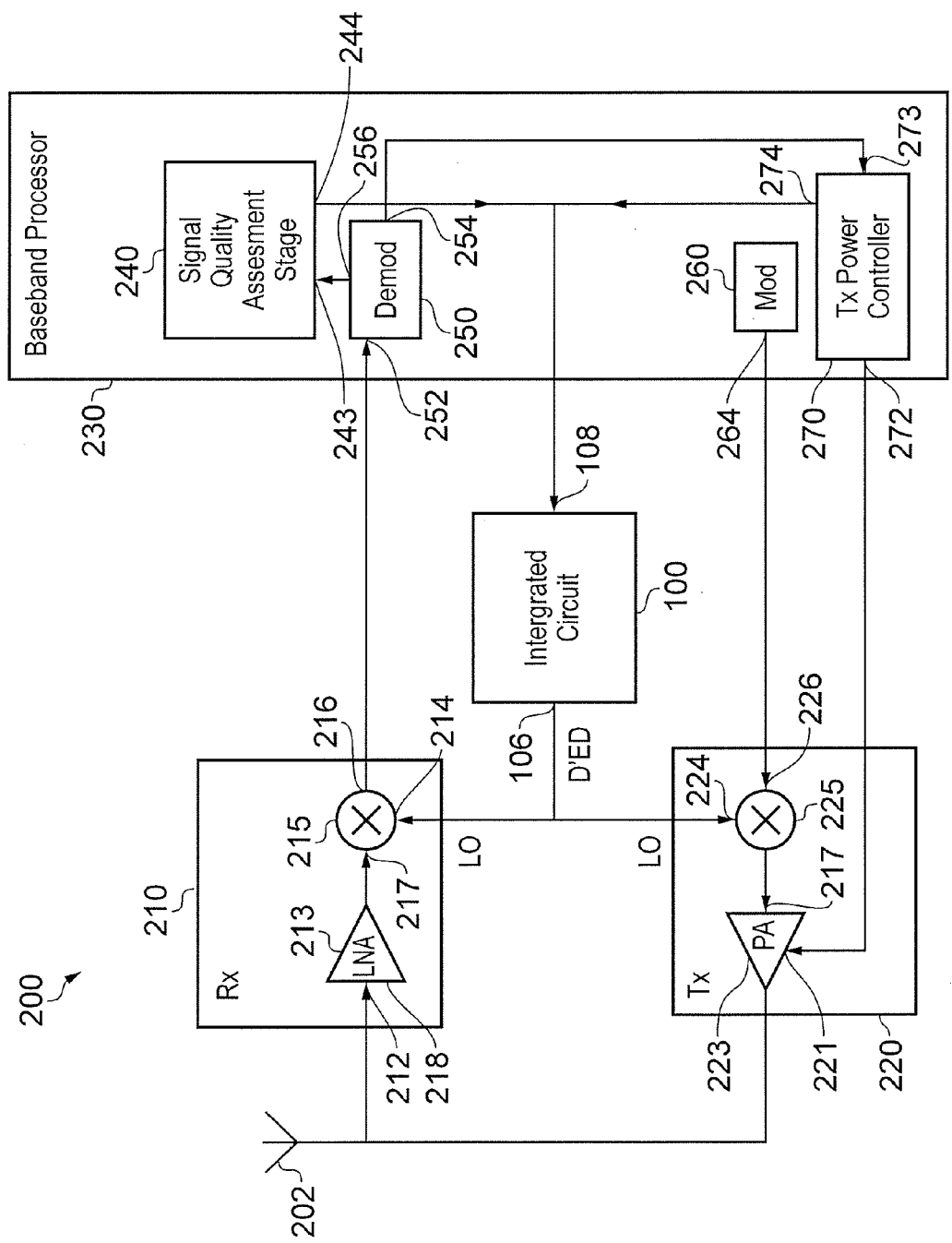
FIG. 4 is a block schematic diagram of a wireless communication apparatus comprising an integrated circuit.

Referring to FIG. 4, a wireless communication apparatus 200 comprises the integrated circuit 100, which may include off-chip external elements. The wireless communication apparatus 200 also comprises an antenna 202 coupled to a first input 212 of a radio frequency (RF) receiver 210 and to an output 222 of an RF transmitter 220. A non-illustrated duplexer may also be present to prevent signals delivered from the RF transmitter 220 to the antenna 202 from entering the RF receiver 210. The wireless communication apparatus 200 also comprises a baseband processor 230 comprising a demodulator 250, a signal quality assessment stage 240, a modulator 260 and a transmitter power controller 270.

The RF receiver 210 comprises a low noise amplifier (LNA) 213 and a down-conversion mixer 215. The first input 212 of the RF receiver 210 is coupled to a signal input 218 of the LNA 213, and an output of the LNA 213 is coupled to a first input 217 of the down-conversion mixer 215. A second input 214 of the down-conversion mixer 215 is coupled to the output 106 of the integrated circuit 100 for receiving the divided signal D'ED from the frequency divider 150 of the clock generation stage 120. The down-conversion mixer 215 employs the divided signal D'ED as a local oscillator signal LO to down-convert to a lower frequency, which may be baseband, an RF signal received at the antenna 202, when the wireless communication apparatus 200 operates in a receive mode. Therefore, the down-converted signal it at a frequency dependent on the frequency of the divided signal D'ED, and consequently dependent on the reference frequency of the reference signal REF. The down-converted signal is delivered at an output 216 of the down-conversion mixer 215. The output 216 of the down-conversion mixer 215 is coupled to an input 252 of the demodulator 250 that demodulates the down-converted signal.

A first output 256 of the demodulator 250 is coupled to a first input 243 of the signal quality assessment stage 240 for delivering the demodulated signal, and the signal quality assessment stage 240 determines a received signal strength of the RF signal received at the antenna 202 and generates an indication of received signal strength of the RF signal (RSSI). The received signal strength of the RF signal is, therefore, a parameter, attribute or characteristic of the RF signal that indicates a signal quality of the RF signal received at the antenna 202. The RSSI is delivered at an output 244 of the signal quality assessment stage 240. The output 244 of the signal quality assessment stage 240 is coupled to the input 108 of the integrated circuit 100, which is coupled to the second input 173 of the power supply regulator 170. In particular, the RSSI is an indication of whether the signal quality of the RF signal is above or below a quality threshold. In one example, the signal quality assessment stage 240 provides to the power supply regulator 170 an indication of whether the RF signal received signal strength is above or below a signal strength threshold, corresponding to the signal quality of the RF signal being above or below the quality threshold.

In response to the indication of signal quality provided at the second input 173 of the power supply regulator 170, the power supply regulator 170 controls the power supplied to the frequency divider 150 of the integrated circuit 110. In particular, if the signal quality of the RF signal is above the quality threshold, the power supply regulator 170 may control the power supplied to the frequency divider 150 dependent on the control signal S generated by the control stage 140, as described above. This enables power to be conserved when the signal quality of the RF signal is relatively high. Conversely, if the signal quality of the RF signal is below the quality threshold, the power supply regulator 170 may cease to control the power supplied to the frequency divider 150 dependent on the control signal S generated by the control stage 140, that is, the power supplied to the frequency divider 150 may be independent on the control signal S. Under these circumstances, the power supplied to the frequency divider 150 is not reduced or increased in response to variations in the control signal S. Such a reduction in power can degrade the sensitivity of the RF receiver 210, and so inhibiting such a reduction can ensure that a high sensitivity is maintained when the signal quality of the RF signal is below the quality threshold. In this way, the power supply regulator 170 is arranged to supply power to the frequency divider 150 at the first voltage, or first current or first power level, if the signal quality of the RF signal is greater than the quality threshold, and the first voltage, first current, or first power level are dependent on the control signal S as described above with reference to FIG. 1. Conversely, the power supply regulator 170 is arranged to supply power to the frequency divider 150 at a second voltage, or second current or second power level, if the signal quality of the RF signal is less than the quality threshold, and the second voltage, second current or second power level, are independent of the control signal S. The second voltage, second current or second power level, are not necessarily constant, but may vary dependent on other factors than the control signal S, such as temperature, or the division ratio of the frequency divider 150 if this has a selectable division ratio, or the frequency of the reference signal REF if that is arranged to vary.

Continuing to refer to FIG. 4, the RF transmitter 220 comprises a power amplifier (PA) 223 and an up-conversion mixer 225. A first input 226 of the up-conversion mixer 225 is coupled to an output 264 of the modulator 260 that delivers a low frequency signal, which may be a baseband signal, for transmission by the wireless communication apparatus 200. A second input 224 of the up-conversion mixer 225 is coupled to the output 106 of the integrated circuit 100 for receiving the divided signal D'ED from the clock generation stage 120. The up-conversion mixer 225 employs the divided signal D'ED from the clock generation stage 120 as a local oscillator signal LO to up-convert the low frequency signal provided by the modulator 260 to a radio frequency for transmission from the antenna 202. Therefore, the radio frequency for transmission is dependent on the divided frequency, and consequently is dependent on the reference frequency of the reference signal REF. The up-converted signal is delivered at an output of the up-conversion mixer 225 that is coupled to a signal input 217 of the power amplifier 223. An output of the PA 223 is coupled to the output 222 of RF transmitter 220 for delivering the up-converted signal to the antenna 202. The PA 223 has a control input 221 that is coupled to a first output 272 of the transmitter power controller for controlling the transmit power level of the RF transmitter 220. The transmit power level is a parameter, attribute or characteristic of the radio frequency signal. The transmit power level of the RF transmitter 220 is selectable, for example being determined dependent on, for example, a closed loop power control algorithm by responding to transmit power control (TPC) bits demodulated by the demodulator 250. For this purpose, a second output 254 of the demodulator 250 is coupled to an input 273 of the transmitter power controller 270 for delivering the TPC bits to the transmitter power controller 270. A second output 274 of the transmitter power controller 270 is coupled to the input 108 of the integrated circuit 100 for controlling the power supplied to the frequency divider 150 of the integrated circuit 100 dependent on the transmit power level of the RF transmitter 220. In particular, if the transmit power level of the RF transmitter 220 is below a transmit power threshold, the power supply regulator 170 may control the power supplied to the frequency divider 150 dependent on the control signal S generated by the control stage 140, as described above. This enables power to be conserved when the transmit power is relatively low. Conversely, if the transmit power level of the RF signal is at or above the transmit power threshold, the power supply regulator 170 may cease to control the power supplied to the frequency divider 150 dependent on the control signal S generated by the control stage 140, that is, the power supplied to the frequency divider 150 may be independent on the control signal S. Under these circumstances, the power supplied to the frequency divider 150 is not reduced or increased in response to variations in the control signal. Such a reduction in power can degrade the noise performance of the RF transmitter 220, resulting in an increase in unwanted out-of-band transmitted noise, so inhibiting such a reduction can ensure that a low level of transmitted noise is maintained when the transmitted power level of the RF signal is above the transmit power threshold. In this way, the power supply regulator 170 is arranged to supply power to the frequency divider 150 at the first voltage, or first current or first power level, if the transmit power level of the RF signal is less than the transmit power threshold, and the first voltage, first current or first power level, are dependent on the control signal S as described above with reference to FIG. 1. Conversely, the power supply regulator 170 is arranged to supply power to the frequency divider 150 at the second voltage, or second current or second power level, if the transmit power level of the RF signal is at or above the transmit power threshold, and the second voltage, second current or second power level, are independent of the control signal S. In one example, the transmit power threshold may correspond to a maximum transmit power available from the PA 223. As described above in relation to the RF receiver 212, the second voltage, second current or second power level are not necessarily constant, but may vary dependent on other factors than the control signal S, such as temperature, or the division ratio of the frequency divider 150 if this has a selectable division ratio, or the frequency of the reference signal if that is arranged to vary.

The integrated circuit 100 may embody, in addition to the elements described with reference to FIGS. 1, 2 and 3, any or all of: the RF receiver 210, the LNA 213, the down-conversion mixer 215, the RF transmitter 220, the up-conversion mixer 225, the PA 223 and the baseband processor 230.

In a further embodiment of the integrated circuit 100 which, in particular, may be employed by the wireless communication apparatus 200, the AND gate 145 of the control stage 140 may be replaced by a phase detector, or delay detector, having first and second inputs coupled to the first and second inputs 142, 143 of the control stage 140 and arranged to provide the intermediate signal I indicative of the relative delay between the clock signal CLK and the delayed clock signal $CLK_A$.

Figure 5:
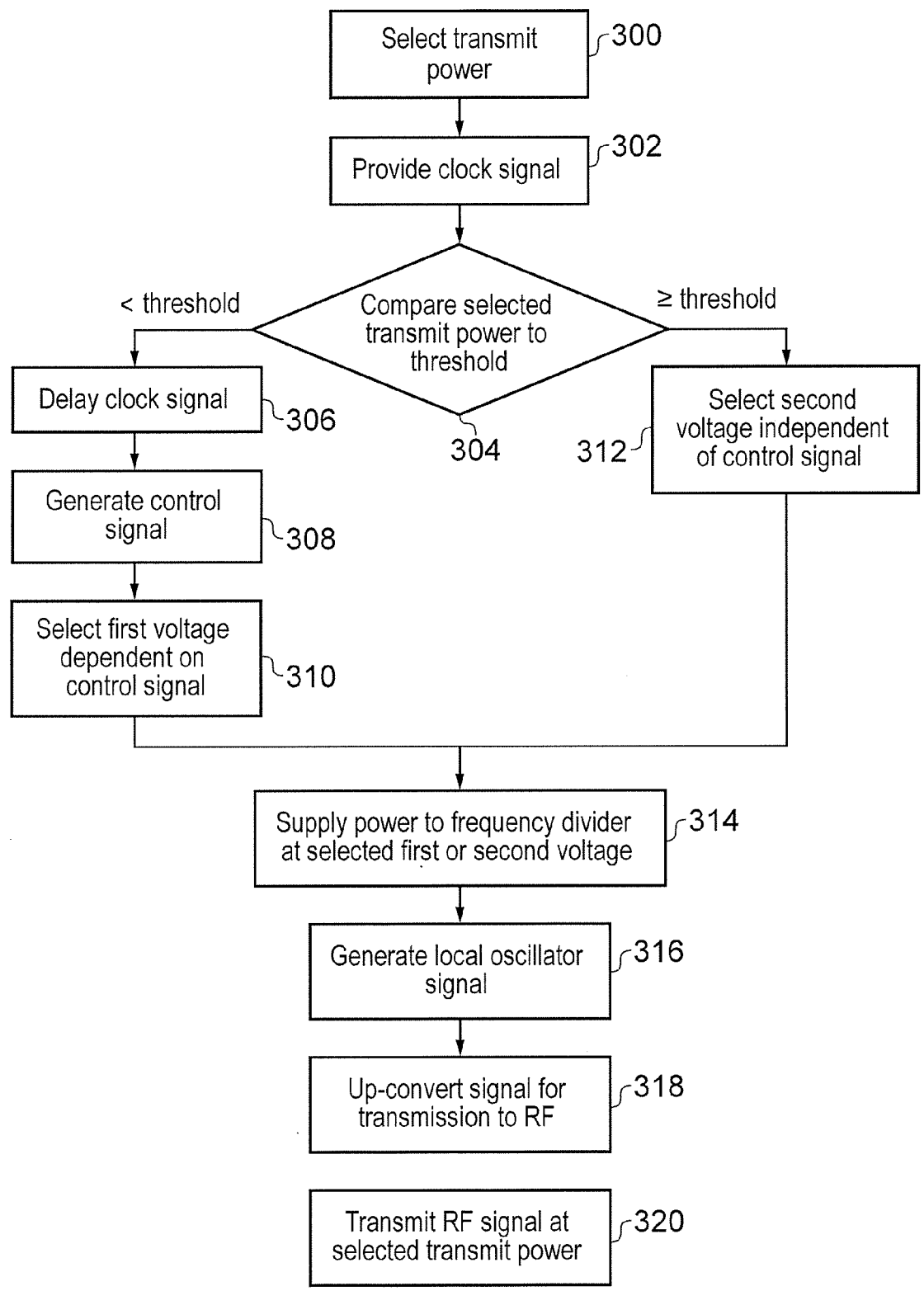
FIG. 5 is a flow chart illustrating a method of operating a wireless communication apparatus.

Referring to FIG. 5, a method of operating the wireless communication apparatus 200 described with reference to FIG. 4, which encompasses a method of operating the integrated circuit 100, commences at step 300 by selecting a transmit power level. This selected transmit power level may depend, for example, on a received instruction or on received TPC bits.

At step 302, the clock signal CLK is provided. At step 304, the selected transmit power level is compared to a transmit power threshold. If the selected transmit power level is less than the transmit power threshold, flow proceeds to step 306.

At step 306 the clock signal CLK is delayed by the delay Δ in the delay stage 130 of the integrated circuit 110, thereby providing the delayed clock signal $CLK_A$. Flow then proceeds to step 308 where the control signal S is generated. The control signal S may be generated by filtering the intermediate signal I generated by forming a logical AND or logical NAND of the clock signal CLK and the delayed clock signal $CLK_A$. Therefore, the intermediate signal I has a first level in response to the clock signal CLK and the delayed clock signal $CLK_A$ both being above the clock signal threshold, and a second level in response to either, or both, of the clock signal CLK and the delayed clock signal $CLK_A$ being below the clock signal threshold. Other logical combinations of the clock signal CLK and the delayed clock signal $CLK_A$ may alternatively be used to form the intermediate signal I, such as a logical OR or logical NOR. Filtering the intermediate signal I smooths transitions in the intermediate signal, and can ensure that the control signal S changes slowly. In some applications, for example where the control signal S is determined during a calibration mode and then used during a subsequent transmit mode, the filtering may provide a constant, that is, DC, value.

More generally, the control signal S is indicative of the relative phase, that is, phase difference, or delay, between the clock signal CLK and the delayed clock signal $CLK_A$, and other circuits may be used to generate the control signal S from the clock signal CLK and the delayed clock signal $CLK_A$. In particular, the control signal S can be proportional to the value of the delay Δ.

From step 308, flow proceeds to step 310 where the first voltage, or first current or first power level, which are dependent on the control signal S, and therefore can vary when the control signal S varies, is selected by the power supply regulator 170. The control signal S can vary, or deviate from a design target value, in response to process variations, temperature variations or frequency variations in the integrated circuit 110 which can cause the value of the delay Δ to vary, or deviate from a design target value.

If, at step 304, the selected transmit power level is greater than or equal to the transmit power threshold, then flow proceeds to step 312 where the second voltage, or second current or second power level, which are independent of the control signal S, and therefore do not vary in response to the control signal S, is selected by the power supply regulator 170.

From steps 310 and 312, flow proceeds to step 314 where power is supplied to the frequency divider 150 of the integrated circuit 110 by the power supply regulator 170 at the selected first or second voltage, or correspondingly the respective first or second current, or first or second power level. At step 316, the local oscillator signal LO is generated from the clock signal CLK, or from the delayed clock signal $CLK_A$, for example by frequency division in the frequency divider 150. The frequency of the local oscillator signal LO is therefore dependent on the clock frequency of the clock signal CLK, and consequently dependent on the reference frequency of the reference signal REF.

At step 318, the local oscillator signal LO generated at step 316 is employed to up-convert to an RF signal a lower frequency signal, which may be a baseband signal, by multiplying the local oscillator signal LO and the lower frequency signal in the up-conversion mixer 225. Then at step 320, the RF signal is transmitted at the transmit power level selected in step 300 by amplification in the PA 223 and propagation by the antenna 202.

Figure 6:
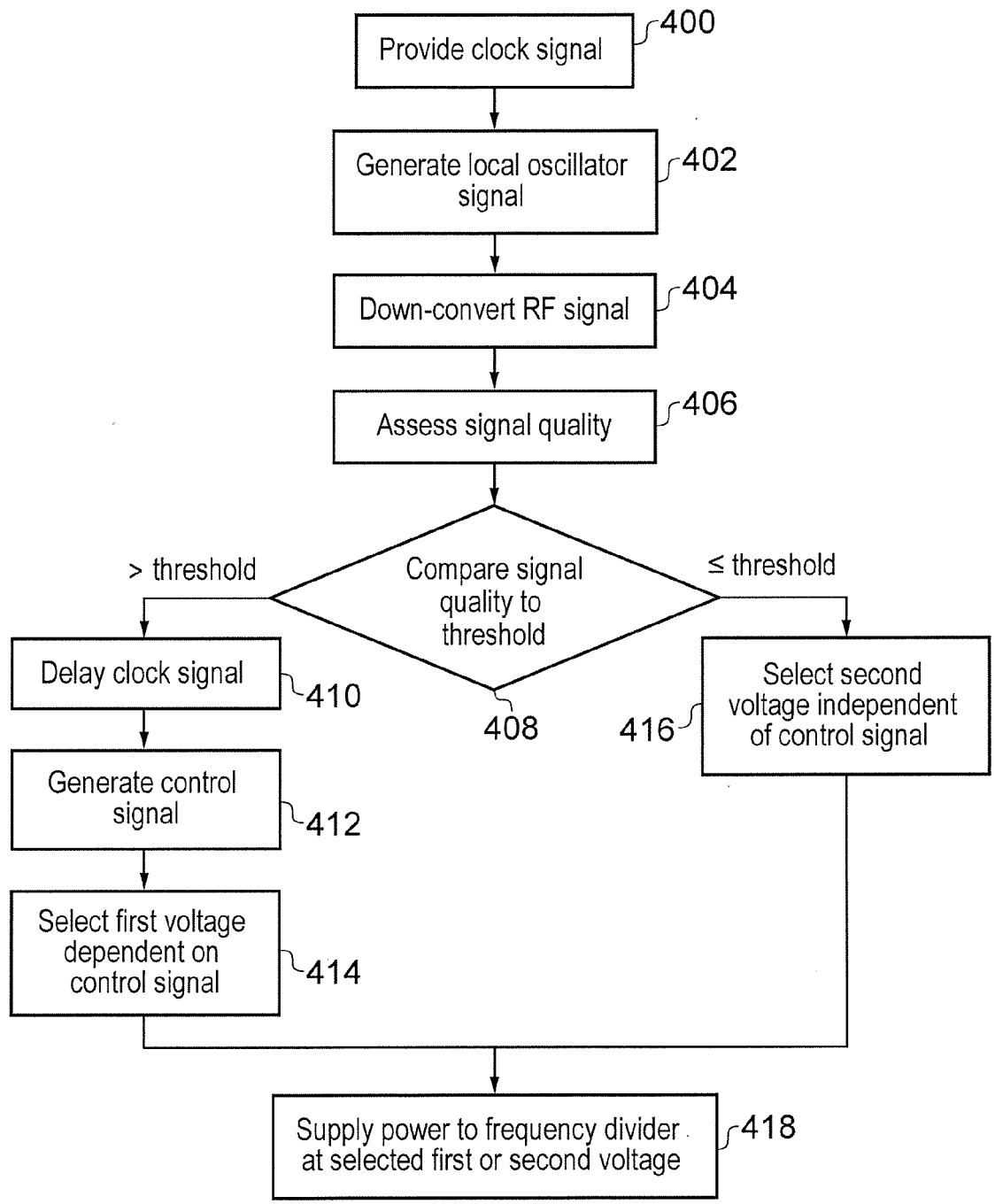
FIG. 6 is a flow chart illustrating another method of operating a wireless communication apparatus.

Referring to FIG. 6, another method of operating the wireless communication apparatus 200 described with reference to FIG. 2, which encompasses a method of operating the integrated circuit 100, commences at step 400 by providing the clock signal CLK. Then, at step 402, a local oscillator signal LO is generated from the clock signal CLK, or from the delayed clock signal $CLK_A$, for example by frequency division in the frequency divider 150. The frequency of the local oscillator signal LO is therefore dependent on the clock frequency of the clock signal CLK, and consequently dependent on the reference frequency of the reference signal REF.

At step 404, the local oscillator signal LO generated at step 402 is employed to down-convert a received RF signal to a lower frequency, which may be baseband, by multiplying the RF signal and the local oscillator signal LO in the down-conversion mixer 215, and the down-converted signal is demodulated by the demodulator 250. Then, at step 406, a quality of the down-converted RF signal is determined by the signal quality assessment stage 240. The quality may be determined, for example, based on the received signal strength of the received RF signal, and an RSSI provided.

At step 408, the signal quality determined at step 406 is compared with a quality threshold. If the signal quality is greater than the quality threshold, then flow proceeds to step 410. At step 410, the clock signal CLK is delayed by the delay Δ in the delay stage 130 of the integrated circuit 110, thereby providing the delayed clock signal $CLK_A$. Flow then proceeds to step 412 where the control signal S is generated. The control signal S may be generated by filtering the intermediate signal I generated by forming a logical AND or logical NAND of the clock signal CLK and the delayed clock signal $CLK_A$. Therefore, the intermediate signal I has a first level in response to the clock signal CLK and the delayed clock signal $CLK_A$ both being above the clock signal threshold, and a second level in response to either, or both, of the clock signal CLK and the delayed clock signal $CLK_A$ being below the clock signal threshold. Other logical combinations of the clock signal CLK and the delayed clock signal $CLK_A$ may alternatively be used to form the intermediate signal I, such as a logical OR or logical NOR. Filtering the intermediate signal I smooths transitions in the intermediate signal, and can ensure that the control signal S changes slowly. In some applications, for example where the control signal S is determined during a calibration mode and then used during a subsequent reception mode, the filtering may provide a constant, that is, DC, value.

More generally, the control signal S is indicative of the relative phase, that is, phase difference, or delay, between the clock signal CLK and the delayed clock signal $CLK_A$, and other circuits may be used to generate the control signal S from the clock signal CLK and the delayed clock signal $CLK_A$. In particular, the control signal S can be proportional to the value of the delay Δ.

From step 412, flow proceeds to step 414 where the first voltage, or first current or first power level, which are dependent on the control signal S, and therefore can vary when the control signal S varies, is selected by the power supply regulator 170. The control signal S can vary, or deviate from a design target value, in response to process variations, temperature variations or frequency variations in the integrated circuit 100 which can cause the value of the delay Δ to vary, or deviate from a design target value.

If, at step 408, the signal quality is less than or equal to the quality threshold, then flow proceeds to step 416 where the second voltage, or second current or second power level, which are independent of the control signal S, and therefore do not vary in response to the control signal S, is selected by the power supply regulator 170.

From steps 414 and 416, flow proceeds to step 418 where power is supplied to the frequency divider 150 of the integrated circuit 100 by the power supply regulator 170 at the selected first or second voltage, or correspondingly a respective first or second current, or first or second power level.

Embodiments have been described in which the control stage 140 comprises a logical AND or NAND gate, and in which the clock signal CLK consists of pulses of duration P, where P is no greater than half of the clock period T of the clock signal CLK.

In embodiments in which the control stage 140 comprises a logical OR or NOR gate, in place of the logical AND or NAND gate, this same constraint on the pulse duration P can ensure that the leading, or rising, edges of the pulses of the clock signal CLK do not occur before the preceding trailing, or falling, edge of the pulses when delayed by the delay stage 130. Although such a constraint is not essential, it can enable a low complexity implementation by enabling the intermediate signal I to have pulses of duration proportional to the delay provided by the delay stage 130, and consequently enables the control signal S to have an average value proportional to the delay provided by the delay stage 130.

Although embodiments have been described in which the first voltage, first current or first power level supplied to the frequency divider 150 by the power supply regulator 170 is controlled dependent on the control signal, a voltage, current or power, supplied to other elements of the integrated circuit 100, and in particular digital circuitry, may also be controlled dependent on the control signal.

Although embodiments have been described in which the first voltage may have the first voltage value in response to the control signal being below a control threshold and the second voltage value in response to the control signal being above the control threshold, in other embodiments there may be a plurality of different control thresholds, and the first voltage may have a plurality of different voltage values, dependent on the position of the control signal relative to the respective control thresholds. In a corresponding manner, the current may have a plurality of different current values, or the first power level may have a plurality of different power values.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfill the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A wireless communication apparatus comprising an integrated circuit,
   the integrated circuit comprising:
   a clock generation stage arranged to generate a clock signal having a clock frequency dependent on a reference signal;
   a delay stage arranged to generate a delayed clock signal by delaying the clock signal ;
   a control stage arranged to generate a control signal indicative of a delay of the delayed clock signal relative to the clock signal;
   a frequency divider arranged to generate a divided signal by dividing a dividend signal having a dividend frequency dependent on the reference frequency; and
   a power supply regulator arranged to supply power to the frequency divider at either, dependent on a parameter of a radio frequency signal, a first power level dependent on the control signal or a second power level independent of the control signal.

2. A wireless communication apparatus as claimed in claim 1, wherein the clock signal comprises pulses having a pulse duration not exceeding fifty percent of a period of the clock signal, where the pulse duration is defined at a mid value of the clock signal, and wherein the delay stage is arranged to delay the clock signal by less than the pulse duration.

3. A wireless communication apparatus as claimed in claim 1, wherein the control stage is arranged to generate an intermediate signal having a first level in response to the clock signal and the delayed clock signal both being above a clock signal threshold and a second level otherwise, and the control stage comprises a filter arranged to filter the intermediate signal to provide the control signal.

4. A wireless communication apparatus as claimed in claim 1, wherein the control stage is arranged to generate an intermediate signal having a first level in response to the clock signal and the delayed clock signal both being below a clock signal threshold and a second level otherwise, and the control stage comprises a filter arranged to filter the intermediate signal to provide the control signal.

5. A wireless communication apparatus as claimed in claim 1, wherein the dividend signal and the clock signal are the reference signal.

6. A wireless communication apparatus as claimed in claim 1, wherein the clock generation stage comprises the frequency divider, the dividend signal is the reference signal and the clock signal is the divided signal.

7. A wireless communication apparatus as claimed in claim 1, wherein the clock signal is the reference signal and the dividend signal is the delayed clock signal.

8. A wireless communication apparatus as claimed in claim 1, wherein the first power level has a first power value in response to the control signal being below a control threshold and a second power value in response to the control signal being above the control threshold.

9. A wireless communication apparatus as claimed in claim 1, wherein the power supply regulator arranged to supply power to the frequency divider at the first power level by supplying power to the frequency divider at a first voltage, the first voltage being dependent on the control signal.

10. A wireless communication apparatus as claimed in claim 1, comprising:
    a radio frequency transmitter arranged to transmit the radio frequency signal at a selectable transmit power level and at a transmit frequency dependent on a frequency of the divided signal;
    wherein the parameter of the radio frequency signal is the selectable transmit power level; and
    wherein the power supply regulator is arranged to supply power to the frequency divider
      at the first power level dependent on the control signal if the selectable transmit power level is below a transmit power threshold, and
      at the second power level independent of the control signal if the selectable transmit power level is not below the transmit power threshold.

11. A wireless communication apparatus as claimed in claim 1, comprising:
    a radio frequency receiver arranged to down-convert the radio frequency signal to a lower frequency, the lower frequency being dependent on a frequency of the divided signal;
    wherein the parameter of the radio frequency signal is a signal quality of the radio frequency signal; and
    a signal quality assessment stage arranged to generate an indication of the signal quality of the radio frequency signal;
    wherein the power supply regulator is arranged to supply power to the frequency divider
      at the first power level dependent on the control signal if the signal quality of the radio frequency signal is greater than a quality threshold, and
      at the second power level independent of the control signal if the signal quality of the radio frequency signal is less than the quality threshold.

12. A wireless communication apparatus as claimed in claim 11, wherein the signal quality assessment stage is arranged to generate the indication of signal quality of the radio frequency signal dependent on a received signal strength of the radio frequency signal.

13. A wireless communication apparatus as claimed in claim 12, wherein the indication of signal quality of the radio frequency signal indicates the signal quality is less than the quality threshold in response to the received signal strength of the radio frequency signal exceeding a received signal strength threshold.

14. A method of operating a wireless communication apparatus, comprising a method of operating an integrated circuit, the method of operating the integrated circuit comprising:
   providing a clock signal having a clock frequency dependent on a reference signal;
   generating a delayed clock signal by delaying the clock signal in a delay stage of the integrated circuit;
   generating a control signal indicative of a delay of the delayed clock signal relative to the clock signal;
   generating a divided signal by dividing, in a frequency divider of the integrated circuit, a dividend signal having a dividend frequency dependent on the reference signal; and
   supplying power to the frequency divider at either, dependent on a parameter of a radio frequency signal, a first power level dependent on the control signal or a second power level independent of the control signal.

* * * * *